(12) United States Patent
Meckel et al.

(10) Patent No.: US 6,497,772 B1
(45) Date of Patent: Dec. 24, 2002

(54) SURFACE TREATMENT FOR IMPROVED HARDNESS AND CORROSION RESISTANCE

(75) Inventors: Nathan K. Meckel, LaMesa, CA (US); Dana Howard Campbell, deceased, late of Palmer, AK (US), by Jeanette Louise Campbell, administrator (73) Assignee: Molecular Metallurgy, Inc., El Cajon, CA (US)

( * ) Notice: Subject to any disclaimer, the term of this patent is extended or adjusted under 35 U.S.C. 154(b) by 5 days.

(21) Appl. No.: 09/671,945

(22) Filed: Sep. 27, 2000

(51) Int. Cl.$^7$ ............................................. C23C 22/78
(52) U.S. Cl. .................. 148/254; 148/262; 148/269; 148/273; 427/333; 427/343; 427/405; 427/419.7
(58) Field of Search ................. 148/247, 254, 148/262, 269, 273; 428/472, 472.3; 427/333, 343, 405, 419.1, 419.7

(56) References Cited

U.S. PATENT DOCUMENTS

| | | | |
|---|---|---|---|
| 4,713,123 A | * 12/1987 | Inokuti et al. | ............... 148/113 |
| 5,724,868 A | 3/1998 | Knudsen et al. | |
| 6,076,264 A | 6/2000 | Meckel | |

FOREIGN PATENT DOCUMENTS

JP          04-006264 A    * 1/1992
JP          02-105342       10/1992

OTHER PUBLICATIONS

The ASM International Handbook Committee, "ASM Handbook Formerly Ninth Edition, Metals Handbook", vol. 13: Corrosion, pp. 383–388, Dec. 1992.*

Herbert H. Uhlig, "Corrosion and Corrosion Control", John Wiley & Sons, 1965, pp. 208–211 (no month data).

Harold Hoffman, "The Complete Metal Finishing Book", H&P Publishing, 1992, pp. 131–154 (no month data).

Korb, et al., ASM Handbook, pp. 383–388, ASM International, The Materials Information Society.

* cited by examiner

Primary Examiner—John Sheehan
Assistant Examiner—Andrew L. Oltmans
(74) Attorney, Agent, or Firm—Nydegger & Associates (57) ABSTRACT

An article is protected with a wear-resistant coating. The wear-coated article is thereafter treated to produce a chemical conversion coating on any portions of the surface of the article accessible through micropores in the wear-resistant coating. For steel articles, the wear-resistant coating is preferably a titanium nitride-based intermetallic compound such as TiN, $Ti_2N$, (TiAl)N, Ti(CN), (TiAl)(CN), ZrN, and CrN, and the chemical conversion coating is preferably a phosphate-based compound.

20 Claims, 4 Drawing Sheets

SURFACE TREATMENT FOR IMPROVED HARDNESS AND CORROSION RESISTANCE

This invention relates to the treatment of articles to provide a wear-resistant, corrosion-resistant surface.

BACKGROUND OF THE INVENTION

Some steel compositions, termed "stainless steels", are inherently partially corrosion resistant, which others, termed herein "common" or "carbon" steels, are not. Articles made of the stainless steels are more expensive than comparable articles made of the common steels. To achieve some of the benefits of stainless steels with reduced cost and also to further enhance some of the stainless steels, the surfaces of steel articles may be treated to improve their corrosion resistance.

In one approach widely used to treat steel articles, such as components of firearms, the article is carefully cleaned in a series of steps, and contacted to a hot, acidic phosphate solution. The phosphate solution reacts with the steel to produce a phosphate-based chemical conversion coating on the surface of the steel. This approach, commonly termed Parkerizing, improves the corrosion resistance of the steel to some corrosive environments. In another approach, the steel article is oxidized in a controlled manner to produce an iron oxide coating, a process termed "bluing" after the resulting color. Many other types of corrosion-resistant coatings for steel and other metals are known.

The commonly available coatings for steels and other metals produce improved corrosion resistance, but they are removed relatively easily by abrasion and are therefore less durable than desired. Additionally, many have colors and physical appearances that are unattractive. For example, Parkerizing may result in a relatively rough surface that does not resist wear well.

On the other hand, there are many approaches that increase the wear resistance of surfaces. Common steels are often carburized or nitrided to produce a carbon-rich or nitrogen-rich region at the surface, which is harder and thence more corrosion resistant than the underlying metal. Unfortunately, such wear-resistant coatings do not have good corrosion resistance in many commonly encountered corrosive environments.

There is a need for an improved surface treatment for metals such as steel, which is both wear resistant and corrosion resistant. The present invention fulfills this need, and further provides related advantages.

SUMMARY OF THE INVENTION

The present invention provides an article having a surface that is both highly wear-resistant and highly corrosion resistant. The color and appearance of the surface may be varied over a wide range by controlling the processing. If, after a period of service, the corrosion resistance of the article is reduced, it may be restored with a relatively simple, inexpensive treatment. In a preferred embodiment, the surface absorbs and retains oil to further improve its corrosion resistance.

In accordance with the invention, an article comprises a substrate having a surface, and a wear-resistant coating on the surface of the substrate, preferably an intermetallic compound, wherein the wear-resistant coating has micropores therethrough. There is a corrosion-resistant coating on that portion of the surface of the substrate accessible through the micropores.

In the associated processing, a method for preparing an article comprises the steps of furnishing a substrate having a surface, wear coating the surface of the substrate with a wear-resistant coating; and thereafter contacting the wear-coated surface of the substrate to a reactant operable to form a corrosion-resistant inorganic coating on the substrate.

The preferred substrate is a steel, preferably a common steel (as distinct from a stainless steel). The wear-resistant coating on the steel is desirably a titanium nitride-based coating including at least one compound selected from the group consisting of titanium nitride (TiN), di-titanium nitride ($Ti_2N$), titanium aluminum nitride ((TiAl)N), titanium carbonitride (Ti(CN)), titanium aluminum carbonitride ((TiAl)(CN)), chromium nitride (CrN), and zirconium nitride (ZrN), and mixtures thereof. These compounds have good wear resistance and their color and physical appearance may be controllably established by the selection of the compound and its processing. The corrosion-resistant coating is preferably a conversion coating such as a phosphate.

The wear-resistant coatings such as the titanium nitride-based coating impart good wear resistance and, where present on the surface, good corrosion resistance. However, the inventors have observed that there may be, and usually are, small openings or cracks, collectively termed "micropores" herein, in the wear-resistant coating. The underlying surface of the article substrate is exposed to the external environment through these micropores. The micropores may be present even in carefully coated articles, or the micropores may be intentionally introduced to retain oil therein. Such micropores may result from irregularities in the coating operation or from subsequent cracking of the wear-resistant coating due to its relatively low ductility. Whatever their source, the micropores provide locations for the initiation of corrosion of the underlying surface, leading to its corrosion damage.

Without this knowledge, the formation of the corrosion-resistant coating after the wear-resistant coating has been applied would seem to be redundant, inasmuch as the material of the wear-resistant coating itself has reasonably good corrosion resistance, and there would be no reason to apply the corrosion-resistant coating after the wear-resistant coating. The subsequently applied corrosion-resistant coating has little effect on the surface of the wear-resistant coating, but it has a significant effect in the portion of the surface of the substrate that is exposed through the micropores. The great majority of the surface of the coated article remains the wear-resistant coating, and consequently the article has good wear resistance to both wearing and erosive damage. Yet it also has excellent corrosion resistance because the otherwise-exposed surface of the article is protected.

The present treatment process of application of a wear-resistant coating followed by application of a corrosion-resistant coating is preferably performed on new articles. At a later time, additional micropores may be produced in the wear-resistant coating by hard use or for other reasons. New unprotected surface regions of the substrate are thereby exposed, and corrosion of these regions may result. In that event, the corrosion-resistance coating procedure may be repeated to protect the newly exposed surface regions.

Other features and advantages of the present invention will be apparent from the following more detailed description of the preferred embodiment, taken in conjunction with the accompanying drawings, which illustrate, by way of example, the principles of the invention. The scope of the invention is not, however, limited to this preferred embodiment.

BRIEF DESCRIPTION OF THE DRAWINGS

FIGS. 7A–C is a series of enlarged cross sectional views of the coated article, wherein FIG. 7A shows a first embodiment, FIG. 7B shows a second embodiment, and FIG. 7C shows a third embodiment.

DETAILED DESCRIPTION OF THE INVENTION

Figure 1:
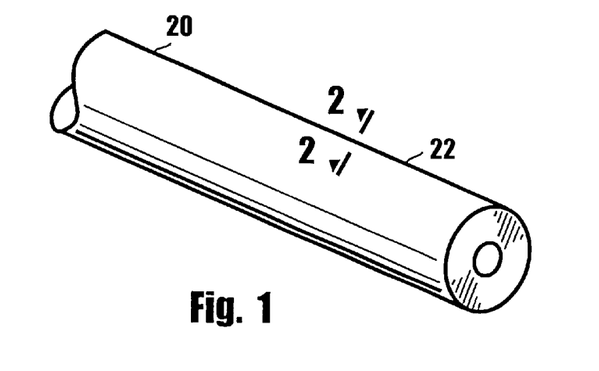
FIG. 1 is a perspective view of an article protected by the approach of the invention.

FIG. 1 depicts an article 20 according to the invention. In a preferred application, the article 20 is a component of a firearm such as a common steel gun barrel. The invention is not limited to this application, however. In fact, a wide variety of articles benefit from the use of the present approach. Examples include sporting goods such as golf club heads, marine hardware, military hardware, industrial hardware, and farm equipment.

Figure 2:
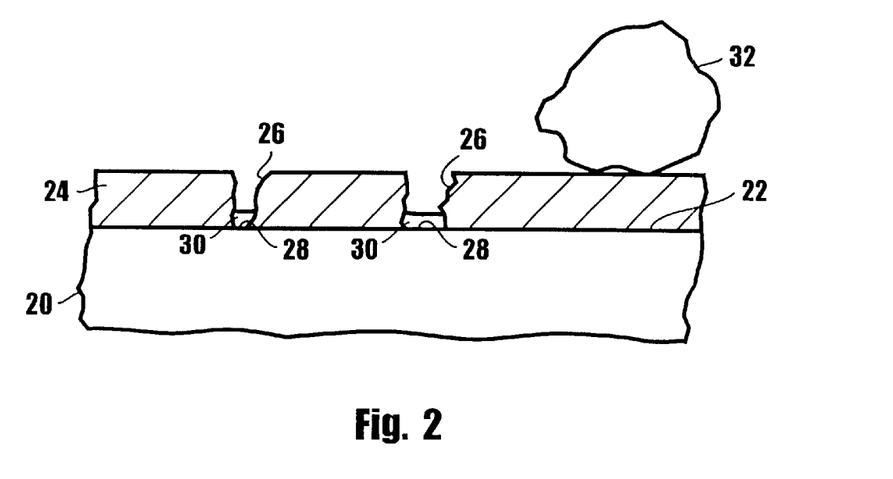
FIG. 2 is an enlarged sectional view of the article of FIG. 1, taken on lines 2—2.

FIG. 2 schematically illustrates the region at a surface 22 of the article 20 in an enlarged view. A wear-resistant coating 24 is applied overlying and is adherent to the surface 22 of the article 20, which serves as a substrate for the coating 24. The wear-resistant coating 24 is also erosion resistant and corrosion resistant, but is termed only "wear resistant" herein for simplicity of expression. The wear-resistant coating is formed of a material whose resistance to wear, erosion, and corrosion is greater than that of the material from which the article 20 is made.

Narrow openings, termed micropores 26 herein, penetrate through the wear-resistant coating 24 to an exposed surface 28 of the article 20. The micropores 26 may be present unintentionally, due to the nature of the deposition process of the wearresistant coating 26. They may also be present intentionally, as the micropores 26 can absorb oil. These micropores are normally quite small in width, but corrosive liquids such as water and gases such as oxygen can penetrate into the micropores 26 to the exposed surface 28. Consequently, the exposed surface 28 would, absent further protection, serve as a site for the initiation of corrosion damage in environments that are otherwise damaging to the material of the article. Although oil may initially be present in the micropores 26 to inhibit corrosion, many corrosive environments cause the oil to be released from the micropores and lost.

A corrosion-resistant coating 30 is formed on the exposed surface 28, within and at the bottoms of the micropores 26. The corrosion-resistant coating 30 is formed by a method that is operable to produce such a coating at the bottoms of the micropores 26. Thus, for example, the corrosion-resistant coating is preferably produced by a gas-phase or a liquid-phase chemical reaction or deposition, rather than a physical deposition technique such as vapor deposition that requires line-of-sight exposure from the deposition source to the deposition region. Such line-of-sight exposure may not be possible for some portions of the exposed surface 28.

The wear-resistant coating 24 protects the surface 22 of the article 24 against wear, erosion, and corrosion over the majority of the surface 22. The corrosion-resistant coating 30 protects the otherwise exposed surface 28 against corrosion, but has relatively small resistance to wear and erosion damage. However, there is little opportunity to damage the corrosion-resistant coating 30 by wear and/or erosion because of the mechanism by which these types of damage occur. Wear and erosion normally occur due to the contacting to the surface of the article of external instrumentalities that are relatively large in size as compared with the width of the micropores 26. As an example, an abrasive particle 32 is illustrated in FIG. 2. (FIG. 2 is not to scale. In practice, the particle 32 is usually very much larger than the lateral size of the pores 26.) Even if this abrasive particle 32 is dragged across the surface of the article or impinged onto the surface of the article, it is too large to penetrate very far into the micropores 26 to their bottoms where the corrosion-resistant coating 30 lies over the otherwise-exposed surface 28. Thus, from the standpoint of the mechanisms of wear and erosion that occur in practical situations, the coated article 20 performs as though the wear-resistant coating 24 is continuous and without the micropores 26. From the standpoint of the mechanism of corrosion that occur in practical situations, the coated article performs as though it has a continuous coating because the wear-resistant coating 24 and the corrosion-resistant coating 30 together cover and protect the entire surface 22 of the article 20. The preferred corrosion-resistant coating 30 is a Parkerized coating, which offers an additional advantage that the Parkerized coating material absorbs extensive amounts of oil, which is not lost from the coating 30 and thence from the micropores 26 in most corrosive environments.

The wear-resistant coating may be an intermetallic compound. Intermetallic compounds are compositions comprising two or more elements that form a stable phase within a metallic matrix. The intermetallic compound may be stable at a single composition or over a range of compositions. Such intermetallic compounds often have substantially higher hardnesses than adjacent compositions, and accordingly exhibit relatively high wear and erosion resistance. They are also typically relatively corrosion resistant.

For steel articles, the preferred wear-resistant coatings are titanium nitride-based compositions such as titanium nitride (TiN), di-titanium nitride ($Ti_2N$), titanium aluminum nitride ((TiAl)N), titanium carbonitride (Ti(CN)), titanium aluminum carbonitride ((TiAl)(CN)), zirconium nitride ) ZrN, and chromium nitride (CrN), or mixtures thereof. Carbide and other coatings may be used as well. The coating may be a single layer of such a composition, or it may have multiple layers as will be discussed subsequently. The chemical abbreviations are not limited to a single composition. For example, "TiN" includes compositions having 25 atomic percent titanium, 75 atomic percent nitrogen; 50 atomic percent titanium, 50 atomic percent nitrogen; and 75 atomic percent titanium, 25 atomic percent nitrogen.

The corrosion-resistant coating 30 is preferably a chemical conversion coating, produced by chemically reacting an externally introduced species with the material of manufacture of the article 20, at the exposed surface 28. Preferred corrosion-resistant coatings for common steels are phosphate coatings produced by reacting hot acidic orthophosphate solutions with the steel. Preferred phosphate coatings are zinc phosphate or manganese phosphate. One of these coatings, termed a Parkerized coating, is the most preferred corrosion-resistant coating 30.

Figure 3:
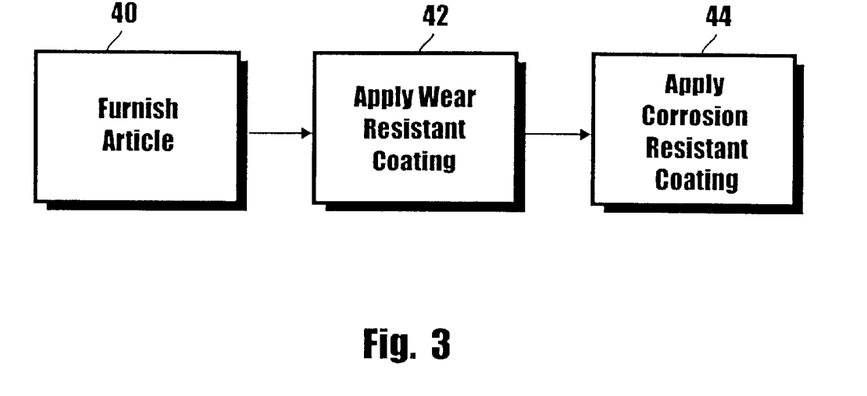
FIG. 3 is a block process flow diagram for a preferred method for practicing the invention.

A preferred method of practicing the present invention is illustrated in FIG. 3. The article 20 is provided, numeral 40, in an uncoated form. The uncoated article is prepared according to the procedures usually used for such articles.

Figure 4:
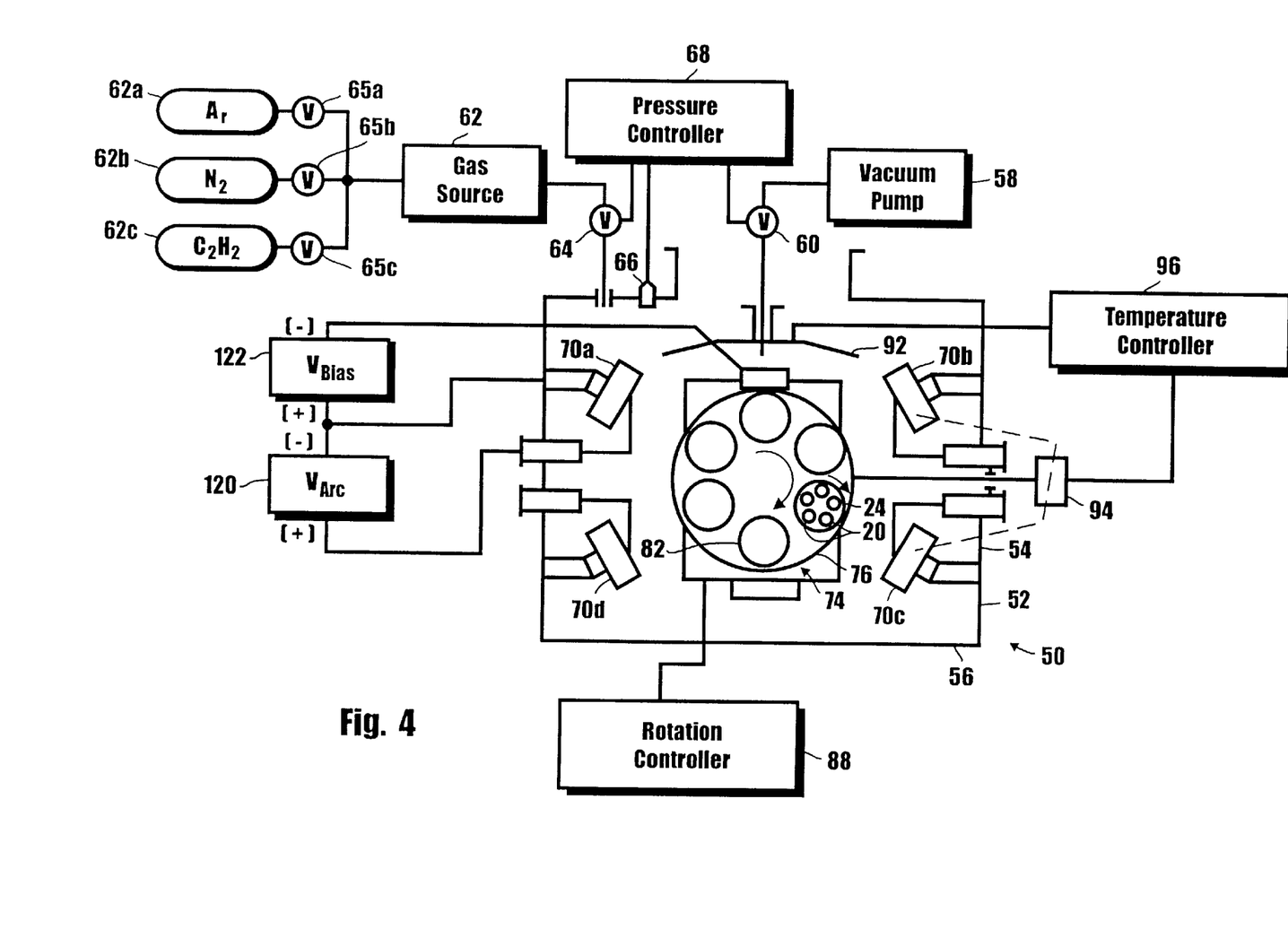
FIG. 4 is a schematic plan view and control diagram of a deposition apparatus according to the invention.
Figure 5:
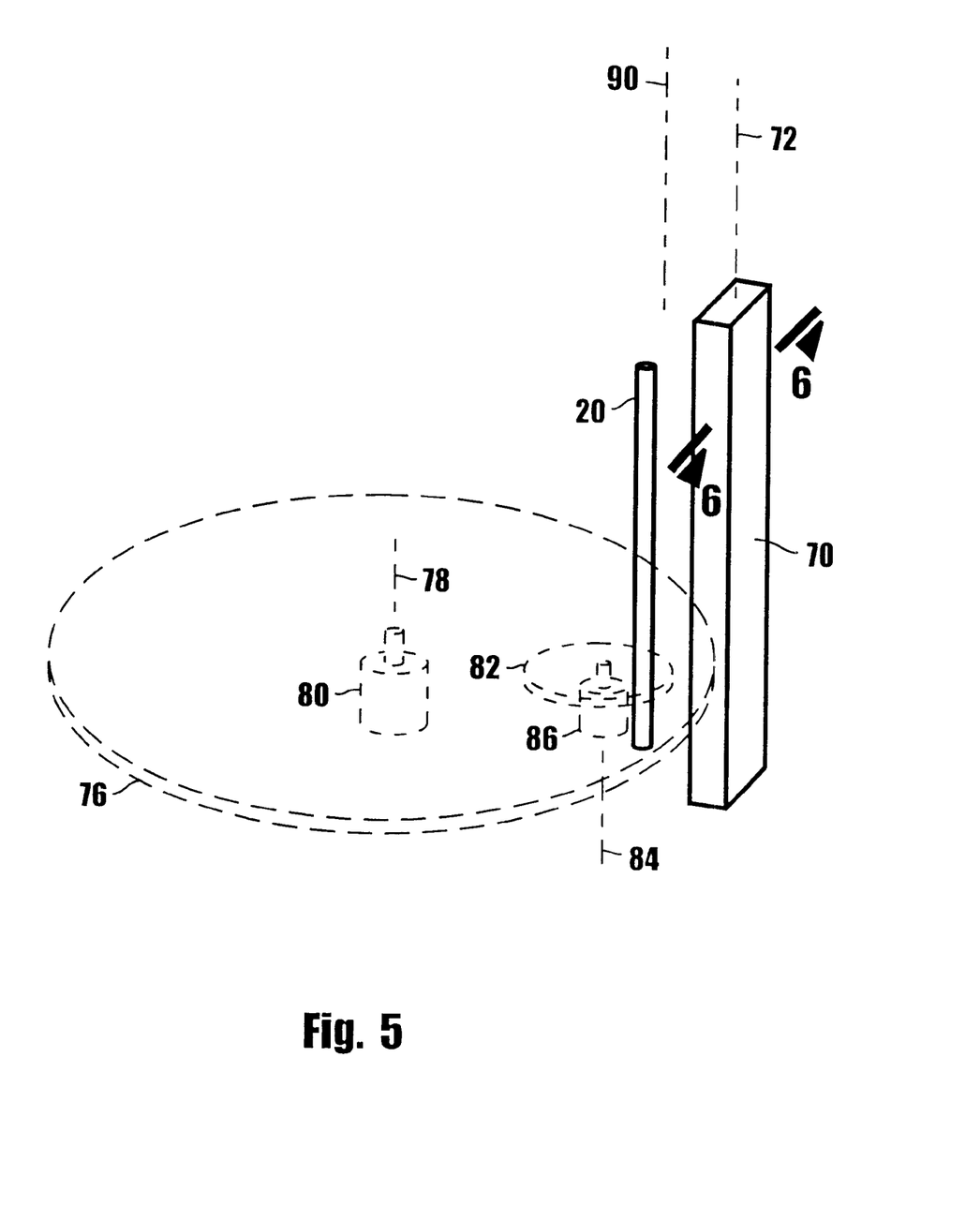
FIG. 5 is a schematic perspective view of a detail of the deposition apparatus of FIG. 4.

The wear-resistant coating 24 is applied, numeral 42. The wear-resistant coating is applied by any operable technique. FIGS. 4 and 5 depict a deposition apparatus 50 used to treat the article 20 by applying the wear-resistant coating 24. The deposition apparatus 50 includes a chamber 52 having a body 54 and a door 56 that may be opened for access to the interior of the chamber 52 and which is hermetically sealed to the body 54 when the chamber 52 is in operation. The interior of the chamber 52 is controllably evacuated by a vacuum pump 58 operating through a gate valve 60. The vacuum pump 58 includes a mechanical pump with blower and a diffusion pump operating together in the usual manner. The interior of the chamber 52 may controllably backfilled to a partial pressure of a selected gas from a gas source 62 through a backfill valve 64. The gas source typically includes several separately operable gases. The gas source 62 usually includes a source 62a of an inert gas such as argon, a source 62b of nitrogen gas, and a source 62c of a carbon-containing gas such as acetylene, each providing gas selectively and independently through a respective selector valve 65a, 65b, or 65c. Other types of gas can also be provided as desired.

The pressure within the chamber 52 is monitored by a vacuum gage 66, whose output signal is provided to a pressure controller 68. The pressure controller 68 controls the settings of the gate valve 60 and the backfill valve 64 (and, optionally, the selector valves 65), achieving a balance of pumping and backfill gas flow that produces a desired pressure in the chamber 52 and thence pressure reading in the vacuum gage 66. Thus, the gaseous backfilled atmosphere within the chamber 52 is preferably a flowing or dynamic atmosphere.

At least two, and preferably four as shown, linear deposition sources 70 are mounted within the interior of the chamber 52 in a circumferentially spaced-apart manner. In FIG. 4, the four deposition sources are identified as distinct sources 70a, 70b, 70c, and 70d, as they will be addressed individually in the subsequent discussion. The four deposition sources 70 are generally rectangular bodies having a greatest rectilinear dimension elongated parallel to a source axis 72. This type of deposition source is distinct from either a stationary point source or a point source that moves along the length of the substrate during deposition procedures.

A substrate support 74 is positioned in the chamber 52. The substrate support 74 produces a compound rotational movement of a substrate mounted thereon. The preferred substrate support 74 includes a rotational carriage 76 that rotates about a rotational axis 78, driven by a rotational drive motor 80 below the rotational carriage 76. Mounted on the rotational carriage 76 are at least one and preferably six, as shown, planetary carriages 82. The planetary carriages 82 are rotationally driven about a rotational axis 84 by a planetary drive motor 86 below the planetary carriages 82. The speeds of the rotational drive motor 80 and the planetary drive motor 86 are controlled by a rotation controller 88. For generality, the rotational drive motor 80 and the planetary drive motor 86 have been discussed separately, but the two movements may be provided by a single motor using appropriate gearing.

For deposition processing, the article 20 is mounted to the planetary carriage 82 with fixturing such that a long axis of the article, if any, is parallel to the rotational axis 84. That is, as the rotational carriage 76 and the planetary carriage 82 rotate, the article 20 is continuously rotated so that all sides are coated. For commercial operations, multiple articles 20 are typically mounted on each planetary carriage 82 in the manner described, as illustrated for one of the planetary carriages 82.

In the deposition apparatus 50, the long axis of the article 20, if any, the source axis 72, the rotational axis 78, and the rotational axis 84 are all arranged to be approximately parallel to a common axis 90.

The temperature of the articles 20 during deposition is controlled using a heater 92 that extends parallel to the deposition sources 70 on one side of the interior of the chamber 52. The heater 92 is preferably a radiant heater operating with electrical resistance elements. Experience has shown that, due to the rotational movement of the carriages 76 and 82 and the heat retention capacity of the articles 20, the single heater 92 on one side of the chamber 52 provides a sufficiently uniform heating of the substrates. The temperature of the substrate articles 20 is monitored by a temperature sensor 94 such as an infrared sensor that views the interior of the chamber. The temperature measured by the sensor 94 is provided to a temperature controller 96 that provides the power output to the heater 92. Acting in this feedback manner, the temperature controller 96 allows the temperature of the substrate articles to be set. (The articles are also heated to some extent by the deposition process, so that the heater acts as the fine tuning instrument to control the temperature of the articles.) In the preferred processing of steel articles 20 with an applied titanium-compound coating, the articles are heated to a temperature of from about 600° F. to about 900° F.

Figure 6:
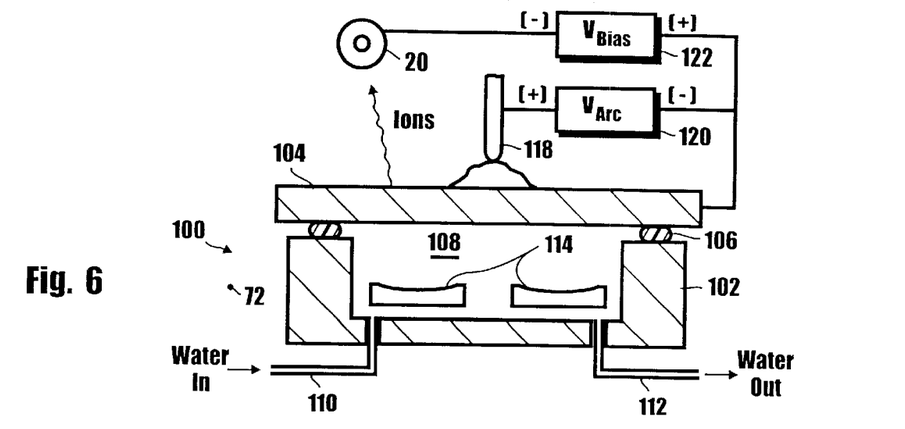
FIG. 6 is a schematic sectional view of a preferred cathodic arc source, taken along lines 6—6 of FIG. 5.

FIG. 6 illustrates a cathodic arc source 100 used in the preferred form of the deposition source 70. The cathodic arc source 100 includes a channel-shaped body 102 and a deposition target 104. The deposition target 104 is in the form of a plate that is hermetically sealed to the body 102 using an O-ring 106, forming a water-tight and gas-tight hollow interior 108. The interior 108 is cooled with cooling water flowing through a water inlet 110 and a water outlet 112. Two concavely shaped permanent magnets 114 extend parallel to the source axis 72 (which extends perpendicular to the plane of the illustration of FIG. 6). Positioned above the deposition target 104 exterior to the body 102 is a striker electrode 118. A voltage $V_{ARC}$ is applied between the striker electrode 118 and the deposition target 104 by an arc source power supply 120. VARC is preferably from about 10 to about 50 volts.

The cationic material that initially forms the deposition target 104 is deposited onto the substrate articles 20, together with, if desired, gas atoms producing anionic species from the atmosphere of the chamber. In the preferred embodiment, the deposition target 104 is made of titanium (Ti), or equiatomic titanium aluminide, or 25 atomic percent Ti, 75 atomic percent Al, or 75 atomic percent Ti, 25 atomic percent Al, all of which are collectively termed TiAl. Other cationic species operable as the deposition target material include metals found in Groups IV–VI of the Periodic Table, including but not limited to vanadium, chromium, zirconium, niobium, molybdenum, hafnium, tantalum, and tungsten. Other metals such as aluminum may be used. The deposition target may also be made of alloys or intermetallic compounds such as, for example, Ti—6Al—4V or $Ti_3Al$.

To accomplish the deposition, an arc is struck between the striker electrode 118 and the deposition target 104, locally heating the deposition target 104 and causing positively charged titanium or titanium aluminide ions (cations) to be ejected from the deposition target 104. (The deposition target 104 is therefore gradually thinned as the deposition proceeds.) The striking point of the arc on the deposition target 104 moves in a racetrack course along the length of the deposition target 104. A negative bias voltage $V_{BIAS}$ is applied between the deposition target 104 and the substrate article 20 by a bias power supply 122, so that the positively charged metallic or intermetallic ions are accelerated toward the article 20.

$V_{BIAS}$ is preferably from about −30 to about −600 volts. The value selected for $V_{BIAS}$ determines the energy of ionic impacts against the surface of the article, a phenomenon termed ion peening. In a typical case, $V_{BIAS}$ is initially selected to be a relatively large negative voltage to achieve good adherence of the first metallic layer (discussed subsequently) to the article substrate. $V_{BIAS}$ is subsequently reduced (made less negative) when overlying hard layers are deposited, to achieve a uniform fine microstructure in the layers. The values of $V_{BIAS}$ are desirably maintained as low as possible consistent with obtaining an adherent coating. $V_{BIAS}$ is more positive than −600 volts, and most preferably more positive than −400 volts. If $V_{BIAS}$ is too negative, corona effects and backsputtering occur at pointed regions of the article, if any, possibly removing the coating already deposited.

The described cathodic arc source is preferred, but other types of sources such as sputtering sources may also be used.

The cooperative selection of the material of the deposition target 104 and the gases introduced into the deposition chamber from the gas source 62 allows a variety of wear-resistant coatings 24 to be deposited onto the article 20. In all cases, the total thickness of the coating 24 is preferably from about 1 micrometer to about 5 micrometers. If the coating thickness is less than about 1 micrometer, the physical properties of the coating are insufficient to produce the desired results. If the coating thickness is more than about 5 micrometers, the coating has a high internal stress that leads to a tendency for the coating to crack and spall away from the article 20 during deposition or during service.

Figure 7A:
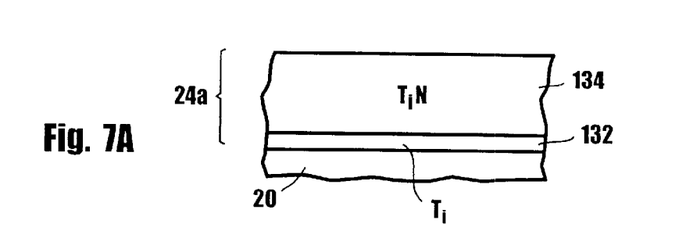
Figure 7B:
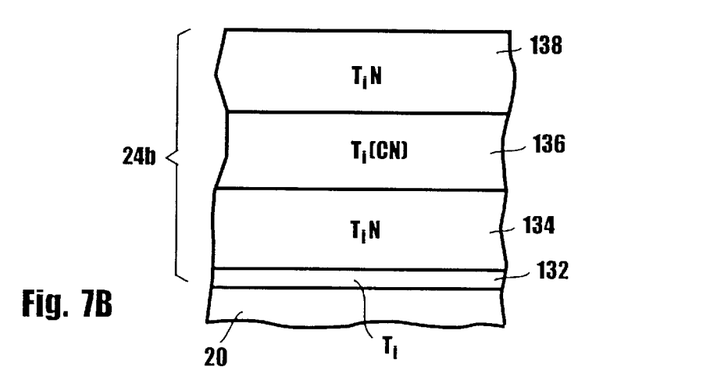
Figure 7C:
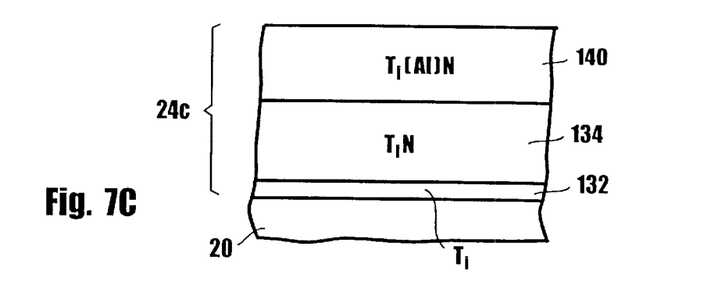

FIGS. 7A–7C depict three coating systems 24a–24c of interest, by way of illustrating the preferred approaches and also the types of coating structures that may be produced. (These figures are not drawn to scale.) The invention is not limited to these coating systems 24a, however. The coating 24a of FIG. 7A includes a first layer 132 of metallic titanium contacting the surface of the article 20. The first metallic layer aids in adhering the overlying layer(s) to the surface of the article. The first layer 132 is preferably quite thin, on the order of from about 100 Angstroms to about 600 Angstroms thick. The first layer 132 is deposited by backfilling the deposition chamber with a small partial pressure of about 5 microns of an inert gas such as flowing argon (flowing at a rate of about 200–450 standard cubic centimeters per minute (sccm) in the apparatus used by the inventors), and then depositing titanium from the deposition target 104 with $V_{BIAS}$ about −400 volts. Because the argon does not chemically react with the titanium, the first layer 132 is metallic titanium. A second layer 134 overlies the first layer 132. The second layer 134 is titanium nitride (TiN), which is deposited by backfilling the deposition chamber with a small partial pressure of about 5 microns of flowing nitrogen (flowing at a rate of about 150–500 sccm in the inventors' apparatus), and then depositing titanium from the deposition target 104 with $V_{BIAS}$ about −50 volts. The titanium cations combine with the nitrogen anions to produce the TiN coating in the layer 134. The second layer 134 is of a thickness such that the total thickness of the coating is from about 1½ to about 5 micrometers.

In another embodiment of a coating 24b, shown in FIG. 7B, the layers 132 and 134 are first deposited using the approach described above in relation to the coating 24a, with the layer 132 having a thickness of about 100–600 Angstroms and the layer 134 having a thickness of about ¼ to about 1 micrometer. A third layer 136 of titanium carbonitride (Ti(CN)) is deposited by backfilling the chamber with a small partial pressure of about 1–2 microns of a flowing carbon-containing gas such as acetylene (flowing at a rate of about 10–150 sccm in the inventors' apparatus) and also a partial pressure of about 3–4 microns of flowing nitrogen (flowing at a rate of about 100–300 sccm in the inventors' apparatus). The total pressure of the carbon-containing gas and nitrogen is about 5 microns. Titanium is deposited from the deposition target 104. The titanium reacts with the carbon from the carbon-containing gas and the nitrogen to deposit the titanium carbonitride third layer 136. A fourth layer 138 of TiN is deposited by repeating the steps used to deposit the second layer 134. The third layer and the fourth layer are preferably each from about ¼ to about 1 micrometer thick. Additional layers may be deposited in an alternating manner, if desired. The thicknesses of the individual layers are selected so that the total thickness of the coating is from about 1½ to about 5 micrometers.

In another embodiment of a coating 24c, shown in FIG. 7C, the layers 132 and 134 are first deposited as described for the coating 24a, in respective thicknesses of about 100–600 Angstroms and about ¼ to about 1 micrometer. A third layer 140 of titanium aluminonitride ((TiAl)N) is deposited by backfilling the chamber with a small partial pressure of about 5 micrometers of flowing nitrogen (flowing at about 100–300 sccm in the inventors' apparatus), and then depositing titanium aluminide from the deposition target 104. The titanium aluminide cationic species reacts with the nitrogen anionic species to produce the third layer.

When titanium is the only cationic species to be deposited into the coating 24, as in the embodiments of FIGS. 7A and 7B, all of the deposition sources 70a, 70b, 70c, and 70d utilize titanium deposition targets 104. When another cationic species such as aluminum is to be deposited with the titanium, as in the embodiment of FIG. 7C, some of the deposition sources utilize titanium deposition targets and some of the deposition sources utilize alloy deposition targets such as TiAl deposition targets. For example, to deposit the coating of FIG. 7C, the deposition sources 70a and 70c are made with titanium deposition targets 104, and the deposition sources 70b and 70d are made with titanium-aluminum deposition targets 104. The pair of sources 70a and 70c is operated during deposition of the layer 132 (with inert gas in the chamber) and the layer 134 (with nitrogen gas in the chamber), and all of the sources 70a–70d are operated during deposition of the layer 140 (with nitrogen gas in the chamber).

The use of various layers within the coating 24 yields results of two different types. First, the mechanical and physical properties of the coating are varied according to the types, hardnesses, and thicknesses of the layers. Second, the color of the coating depends upon the layer which is exposed at the top of the coating. The color produced by this coating technique is long-lasting and will not readily spall or be worn away from the surface because of the hardness of the coating, a desirable feature because the coated article exhibits an attractive external appearance. For example, a TiN top coating is a golden yellow color, whereas a (TIAl)N top coating is a lustrous gray color. Other coatings such as $Ti_2N$ and (TiAl)(CN) may be applied to vary the properties and color of the coating.

FIGS. 7A–7D illustrate a relatively small number of layers as forming the coatings 24. The present approach may use many more layers if desired, to produce a wide variety of properties in the coating 24. The first metallic layer 132 is usually of the same base metal as the overlying layers, but it need not be. The overlying layers may be of the same or different compositions.

To the naked eye, the wear-resistant coating 24 applied in step 42 may appear to be continuous and without micropores 26. However, it is virtually impossible to deposit the most desirable wear-resistant coatings 24 without some micropores 26 present. Accordingly, in the present invention the treatment required to produce the corrosion-resistant coating 30 is performed, regardless of whether there appear to be micropores 26 present or not.

The procedure necessary to apply the corrosion-resistant coating 30 is performed, numeral 44, so as to apply the corrosion-resistant coating to any otherwise-exposed surfaces 28. The step 44 must follow, not precede or be concurrent with, the step 42. That is, the wear-resistant coating 24 must be applied prior to the corrosion-resistant coating 30, and not after or concurrently with the application of the corrosion-resistant coating.

The corrosion-resistant coating is an inorganic coating, not an organic coating or organically-derived coating such as a paint. The corrosion-resistant coating may be applied by any operable technique. The application of a conversion coating from liquid solution is preferred, although other operable procedures may be used. Procedures for producing conversion coatings are well known in the art for particular metal substrates and for use in other circumstances and applications. See, for example, Harold Hoffman, "The Complete Metal Finishing Book", H & P Publishing, San Angelo, Tex. (1992) at chapter 5, pages 131–142 on Parkerizing Metal. Briefly, a phosphate conversion coating termed a Parkerized coating is produced by first cleaning all dirt and scale from the surface of the article using physical and chemical cleaning techniques. The article is thereafter boiled in an acidic phosphate solution such as hot dilute manganese or zinc orthophosphate, for example $ZnH_2PO_4$ plus $H_3PO_4$ solution, typically at a temperature of about 170° F. for a time of about 40 minutes.

The coating 24 may optionally be treated to infiltrate oil into the surface, as part of the step 44. A Parkerized coating absorbs oil well, leading to a strong absorption and retention of oil in the corrosion-resistant coating 30 and thence in the coating structure. By comparison, where there is only the wear-resistant coating 24 with its micropores 26, oil may be desirably absorbed into the micropores but then released during exposure to aggressive environments that cause corrosion.

The present invention has been reduced to practice in two separate test series. In the first test series, three separate groups golf club putter heads were left uncoated, were coated with (TIAl)N coating, and were coated with (TIAl)N coating and thereafter Parkerized. All of the golf club putter heads were thereafter oiled. Different ones of the golf club putter heads within each of the three groups were made of 1018 steel and 11-L17 steels, but the results for the two different types of steels were substantially the same. The various golf club putter heads were placed into a salt spray chamber and comparatively tested. The uncoated golf club putter heads lost their oiling and rusted extremely badly. The golf club putter heads with (TIAl)N coating only lost their oiling and rusted, but not as extensively as the uncoated golf club putter heads. The golf club putter heads that were coated with (TIAl)N and then Parkerized retained their oiling and did not rust.

In the second test series, a set of rifle barrels were made of stainless steel, and another set of rifle barrels were made of chromium-molybdenum steel. The chromium-molybdenum steel rifle barrels were coated with (TiAl)N and then Parkerized. Both sets of rifle barrels were oiled. Both sets of rifle barrels were exposed to salt spray at an ocean inlet in Alaska for about 6 months. At the end of this exposure period, the stainless steel rifle barrels were corroded, but the chromium-molybdenum steel rifle barrels were uncorroded.

Although a particular embodiment of the invention has been described in detail for purposes of illustration, various modifications and enhancements may be made without departing from the spirit and scope of the invention. Accordingly, the invention is not to be limited except as by the appended claims.

What is claimed is:

1. A method for preparing an article, comprising the steps of
   furnishing a substrate having a surface;
   wear coating the surface of the substrate with a wear-resistant coating having micropores; and thereafter
   penetrating the micropores and contacting the surface of the substrate with a reactant operable with the surface of the substrate to form a corrosion-resistant inorganic coating on the substrate.

2. The method of claim 1, wherein the step of furnishing a substrate includes the step of
   furnishing a steel substrate.

3. The method of claim 1, wherein the step of furnishing a substrate includes the step of
   furnishing a substrate which is a component of a firearm.

4. The method of claim 1, wherein the step of wear coating includes the step of
   wear coating the surface of the substrate with an intermetallic compound.

5. The method of claim 1, wherein the step of wear coating the substrate includes the step of
   wear coating the substrate with a wear-resistant coating comprising a titanium nitride-based coating including at least one compound selected from the group consisting of TiN, $Ti_2N$, (TiAl)N, Ti(CN), (TiAl)(CN), ZrN, and CrN, and mixtures thereof.

6. The method of claim 5, wherein the step of wear coating includes the step of
   depositing at least two layers of the titanium-nitride based coating, the two layers having different compositions.

7. The method of claim 1, wherein the step of penetrating the micropores and contacting the surface of the substrate includes the step of
   providing an acidic bath further comprising a phosphate selected from the group consisting of an iron-phosphate, a zinc-phosphate, and a manganese phosphate.

8. The method of claim 1, wherein the step of wear coating includes the step of
   applying the coating to a thickness of from about 1 micrometer to about 5 micrometer.

9. The method of claim 1, wherein the step of wear coating the substrate includes the steps of
   providing a deposition apparatus comprising
      at least two linear deposition sources, each of the deposition sources lying parallel to an axis and each of the deposition sources being a source of a cationic species, an anion source of an anionic species reactive with the cationic species to produce a coating material, a substrate support adapted for rotational movement about the axis, and a substrate heater;

mounting the substrate in the substrate support;

heating the substrate to a substrate deposition temperature;

rotating the substrate support about the axis; and operating the deposition sources to deposit the respective coating material onto the substrate, the steps of heating, rotating, and operating to occur simultaneously.

10. The method of claim 9, wherein each of the deposition sources comprises a cathodic arc source.

11. The method of claim 9, wherein the step of operating includes the step of operating the deposition sources for a period sufficient to deposit from about 1 to about 5 micrometers of the wear-resistant coating material onto the surface of the substrate.

12. The method of claim 9, wherein the step of providing a deposition apparatus includes the step of providing at least two deposition sources of a compound of titanium.

13. A method for preparing an article, comprising the steps of furnishing a steel substrate;

wear coating the substrate with a titanium nitride-based, wear-resistant coating having micropores; and thereafter penetrating the micropores of the wear-resistant coating to contact the substrate with a fluid containing an acidic phosphate.

14. The method of claim 13, wherein the step of wear coating includes the step of:

applying the coating to a thickness of from about 1 micrometer to about 5 micrometers.

15. The method of claim 13, wherein the step of wear coating the substrate includes the steps of:

providing a deposition apparatus comprising:
at least two linear deposition sources, each of the deposition sources lying parallel to an axis and each of the deposition sources being a source of a cationic species;

an anion source of an anionic species reactive with the cationic species to produce a coating material;

a substrate support adapted for rotational movement about the axis, and a substrate heater;

mounting the substrate in the substrate support;

heating the substrate to a substrate deposition temperature;

rotating the substrate support about the axis; and operating the deposition sources to deposit the respective coating material onto the substrate, the steps of heating, rotating, and operating to occur simultaneously.

16. A method for preparing an article, comprising the steps of:

furnishing a substrate which is a component of a firearm, the substrate having a surface;

wear coating the surface of the substrate with a wear-resistant coating; and thereafter contacting the wear-coated surface of the substrate to a reactant operable to form a corrosion-resistant inorganic coating on the substrate.

17. The method of claim 16, wherein the step of furnishing a substrate includes the step of:

furnishing a steel substrate.

18. The method of claim 16, wherein the step of wear coating includes the step of:

wear coating the surface of the substrate with an intermetallic compound.

19. The method of claim 16, wherein the step of wear coating the substrate includes the step of:

wear coating the substrate with a wear-resistant coating comprising a titanium nitride-based coating including at least one compound selected from the group consisting of TiN, $Ti_2N$, (TiAl)N, Ti(CN), (TiAl)(CN), ZrN, and CrN, and mixtures thereof.

20. The method of claim 16, wherein the step of penetrating the micropores and contacting the surface of the substrate includes the step of:

providing an acidic bath further comprising a phosphate selected from the group consisting of an iron-phosphate, a zinc-phosphate, and a manganese phosphate.

* * * * *

UNITED STATES PATENT AND TRADEMARK OFFICE
CERTIFICATE OF CORRECTION

PATENT NO. : 6,497,772 B1
DATED : December 24, 2002
INVENTOR(S) : Nathan K. Meckel and Dana Howard Campbell It is certified that error appears in the above-identified patent and that said Letters Patent is hereby corrected as shown below:

Column 6,
Line 45, delete "VARC" insert -- $V_{ARC}$ --

Signed and Sealed this

Eleventh Day of March, 2003

JAMES E. ROGAN
*Director of the United States Patent and Trademark Office*